United States Patent
Spevak

(10) Patent No.: US 9,369,147 B2
(45) Date of Patent: Jun. 14, 2016

(54) ADJUSTABLE AND BUFFERED REFERENCE FOR ADC RESOLUTION AND ACCURACY ENHANCEMENTS

(71) Applicant: TEXAS INSTRUMENTS DEUTSCHLAND GmbH, Freising (DE)

(72) Inventor: Peter Spevak, Moosburg a.d. Isar (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/491,633

(22) Filed: Sep. 19, 2014

(65) Prior Publication Data

US 2016/0006449 A1  Jan. 7, 2016

Related U.S. Application Data

(60) Provisional application No. 62/020,533, filed on Jul. 3, 2014.

(51) Int. Cl.
*H03M 1/12* (2006.01)
*H03M 1/34* (2006.01)
*H03M 1/00* (2006.01)

(52) U.S. Cl.
CPC . *H03M 1/34* (2013.01); *H03M 1/00* (2013.01); *H03M 1/12* (2013.01)

(58) Field of Classification Search
CPC .................................. H03M 1/12; H03M 1/00
USPC ................................. 341/155, 156, 120, 118
See application file for complete search history.

(56) References Cited

U.S. PATENT DOCUMENTS 6,744,826 B2 * 6/2004 Rabii .................. H03G 3/3052
327/58

* cited by examiner

*Primary Examiner* — Joseph Lauture
(74) *Attorney, Agent, or Firm* — Gregory J. Albin; Frank D. Cimino

(57) ABSTRACT

An analog to digital converter (ADC) core; a reference voltage generator coupled to an input of the ADC core; a bandgap reference coupled to the reference voltage generator; and a window comparator configured to control a selected reference voltage range generated by the reference voltage generator and received by the ADC core.

10 Claims, 1 Drawing Sheet

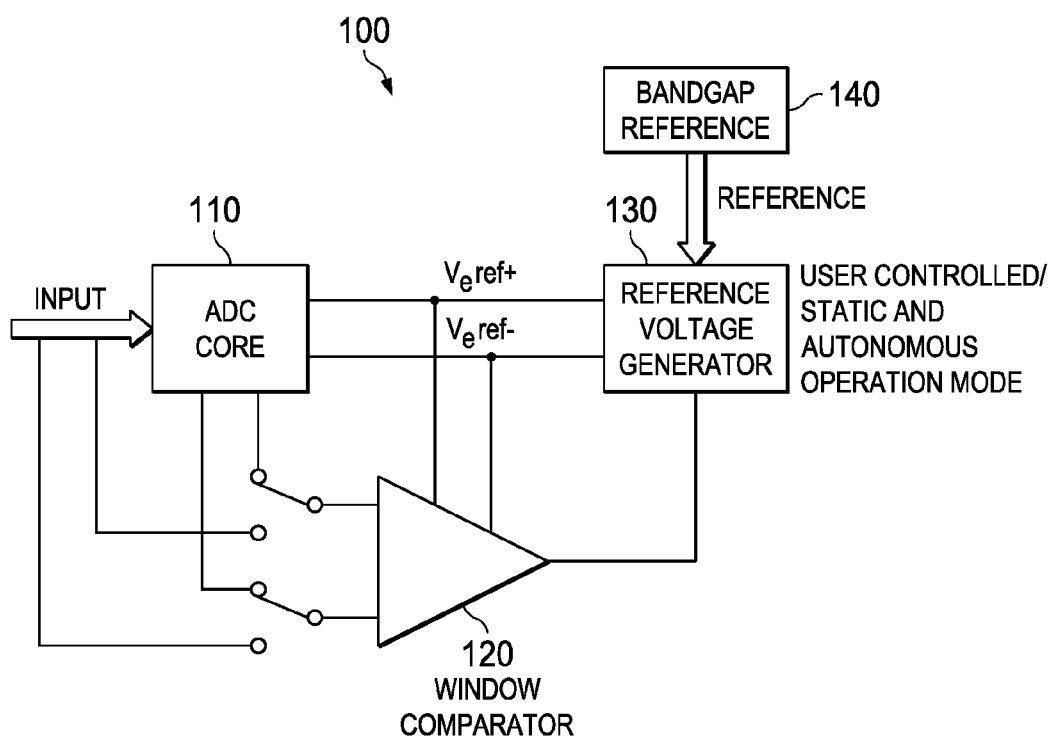

ADJUSTABLE AND BUFFERED REFERENCE FOR ADC RESOLUTION AND ACCURACY ENHANCEMENTS

PRIORITY

This Application claims priority to U.S. Provisional Application No. 62/020,533, filed Jul. 3, 2014, entitled "Adjustable and Buffered Reference for ADC Resolution and Accuracy Enhancements", which is incorporated by reference in its entirety.

TECHNICAL FIELD

This Application is directed, in general, to an adjustable reference for an Analog to Digital Converter (ADC) and, more specifically, to an adjustable and buffered reference for an ADC resolution and accuracy enhancements.

BACKGROUND

Increased demand on ADC performance is imposing harder and harder requirements on the ADC resolution, resulting in longer design cycles, facing semiconductor technology challenges.

The demand on ADC accuracy and resolution is increasing. Especially for new µC architectures, being under cost pressure and having to migrate to cost optimized process nodes for digital, it is difficult to keep up with the integration of high performance of analog, like ADCs.

Therefore, there is a need in the art as understood by the present inventors to addresses at least some of the concerns of the usage of the prior art.

SUMMARY

A first aspect provides an apparatus as described herein.

A second aspect provides an apparatus, comprising: an analog to digital converter (ADC) core; a reference voltage generator coupled to an input of the ADC core; a bandgap reference coupled to the reference voltage generator; and a window comparator configured to control a selected reference voltage range generated by the reference voltage generator and received by the ADC core.

A third aspect provides an apparatus, comprising: means for an analog to digital conversion (ADC); a reference voltage generator coupled to an input of the ADC core; a bandgap reference coupled to the reference voltage generator; and a window comparator configured to control a selected reference voltage range generated by the reference voltage generator and received by the ADC core.

BRIEF DESCRIPTION OF THE DRAWINGS

Reference is now made to the following descriptions:

The FIGURE illustrates an adjustable and buffered reference for an ADC system 100.

DETAILED DESCRIPTION

Turning to the Figure, illustrated is one aspect of an adjustable and buffered reference for an ADC system 100. An ADC core 110 receives input. The ADC core 110 receives Vref+ and Vreg− two input signals. By a reference voltage generator 130. The ADC core 110 also controls inputs of the window comparator 120, to determine whether the inputs are to be conveyed to the window comparator 120 from the ADC core itself, or from an input directly. The window comparator 120 is then used to control the reference voltage generator 130, which generates V ref+ and Vref−, and also receives the bandgap reference 140 as a basis of control.

Generally, the window comparator 120 controls and switches the selected reference voltage range used for input comparison, and delivers and contributes to the AD conversion result. The window comparator 120 uses the conversion result to control the reference voltage generator 130.

Generally, in the system 100, instead of increasing only the number of ADC bits (10 bit, 12 bit, 16 bit . . . ) an intelligent method of adjusting the reference voltages to the input signal range is used by the window comparator 120, and thus avoid, on one hand, wasting ADC resolution, or even to focus the ADC resolution to a limited input signal range, and thus use the ADC resolution in an optimum way. Moving to dynamic reference voltage range switching by the window comparator 120 allows even focusing the entire ADC resolution to a certain input range interval. Compared to an ADC solution, where the reference voltage is fixed to OV−Vref+, this would reduce the required number of bits of the ADC, to achieve the same resolution and accuracy.

The straight forward solution, increasing the number of bits of the ADC is imposing more and more risk on the implementation side, increasing the risks in the analog design, especially on mixed signal devices.

In a further aspect, generally, Instead of increasing the number of bits of the ADC from 10 bit to 12 bit to 16 bit and more, a lower resolution ADC could be used. The approach of the present disclosure would be achieved by adjusting the ADC range by a configurable and buffered reference source for both positive and negative voltage reference, dependent on the input signal range.

In a yet further aspect, a fast 10 bit, 12 bit ADC, capable of operation with lowest possible reference voltage difference (Vref−/Vref+). The reference voltage reference generator 130 can be a multiplexer e.g. resistive ladder. Two reference voltage buffers, supplying the resulting voltage references, such as selected from VsRef+ and VsRef−.

In one example implementation, the system 100 is employed in a Temperature Sensor with analog output for temperature-range output levels in the range of 500 mV-1200 mV. However, the Goal is 0.7 mV resolution In the prior art, this can be achieved by a 12 bit ADC and 1.5V reference (OV/1.5V). However, with the approach of the present disclosure, a focusing of the ADC range to 500 mV/1200 mV a 10 Bit ADC would be sufficient.

Those skilled in the art to which this application relates will appreciate that other and further additions, deletions, substitutions and modifications may be made to the described embodiments.

What is claimed is:

1. An apparatus, comprising:
    an analog to digital converter (ADC) core;
    a reference voltage generator coupled to an input of the ADC core;
    a bandgap reference coupled to the reference voltage generator; and
    a window comparator configured to control a selected reference voltage range generated by the reference voltage generator and received by the ADC core.

2. The apparatus of claim 1, wherein a resolution of the ADC core is mapped to an effective number of bits of a targeted signal input range.

3. The apparatus of claim 1, wherein the ADC core is a ten bit ADC core.

4. The apparatus of claim 1, wherein the reference voltage generator comprises a voltage reference multiplexer.

5. The apparatus of claim 4, wherein the voltage reference multiplexer comprises a resistive ladder.

6. An apparatus, comprising:
   means for performing an analog to digital conversion;
   a reference voltage generator coupled to an input of the means for performing the analog to digital conversion;
   a bandgap reference coupled to the reference voltage generator; and
   a window comparator configured to control a selected reference voltage range generated by the reference voltage generator and received by the means for performing the analog to digital conversion.

7. The apparatus of claim 6, wherein a resolution of the means for performing the analog to digital conversion is mapped to an effective number of bits of a targeted signal input range.

8. The apparatus of claim 6, wherein the means for performing the analog to digital conversion is a ten bit ADC core.

9. The apparatus of claim 6, wherein the reference voltage generator comprises a voltage reference multiplexer.

10. The apparatus of claim 6, wherein the voltage reference multiplexer comprises a resistive ladder.

\* \* \* \* \*